United States Patent
Zhou et al.

(10) Patent No.: US 9,872,391 B2
(45) Date of Patent: Jan. 16, 2018

(54) CAPACITOR STRUCTURE AND CAPACITOR USING THE SAME

(71) Applicant: TELEFONAKTIEBOLAGET LM ERICSSON (PUBL), Stockholm (SE)

(72) Inventors: Bo Zhou, Jiangsu (CN); Kun Liu, Jiangsu (CN); Junyou Chen, Jiangsu (CN); Yang Ji, Jiangsu (CN)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 15/115,120

(22) PCT Filed: Jan. 28, 2014

(86) PCT No.: PCT/CN2014/071685
§ 371 (c)(1),
(2) Date: Jul. 28, 2016

(87) PCT Pub. No.: WO2015/113215
PCT Pub. Date: Aug. 6, 2015

(65) Prior Publication Data
US 2016/0381797 A1    Dec. 29, 2016

(51) Int. Cl.
| | |
|---|---|
| H05K 1/16 | (2006.01) |
| H05K 1/02 | (2006.01) |
| H05K 1/11 | (2006.01) |
| H01L 49/02 | (2006.01) |
| H01G 4/30 | (2006.01) |
| H01G 4/232 | (2006.01) |
| H01G 4/012 | (2006.01) |
| H01G 4/12 | (2006.01) |

(52) U.S. Cl.
CPC ............ *H05K 1/162* (2013.01); *H01G 4/012* (2013.01); *H01G 4/232* (2013.01); *H01G 4/30* (2013.01); *H01L 28/60* (2013.01); *H05K 1/0298* (2013.01); *H05K 1/115* (2013.01); *H01G 4/12* (2013.01)

(58) Field of Classification Search
CPC ...... H05K 1/162; H05K 1/0298; H05K 1/115; H01L 28/60; H01G 4/12; H01G 4/232; H01G 4/30
USPC ........................................ 174/251; 361/306.3
See application file for complete search history.

(56) References Cited

U.S. PATENT DOCUMENTS

| | | | |
|---|---|---|---|
| 2007/0247783 A1 | 10/2007 | Shimizu et al. | |
| 2007/0290929 A1 | 12/2007 | Noro et al. | |
| 2008/0239619 A1 | 10/2008 | Okamoto et al. | |
| 2010/0277851 A1 | 11/2010 | Niki | |
| 2011/0151803 A1* | 6/2011 | van der Heijden | H01L 23/5223 455/73 |
| 2011/0292565 A1 | 12/2011 | Chiu et al. | |

(Continued)

FOREIGN PATENT DOCUMENTS

CN     101640519 A    2/2010

OTHER PUBLICATIONS

Casares-Miranda, et al., Wire Bonded Interdigital Capacitor, IEEE Microwave and Wireless Components Letters, vol. 15, No. 10, pp. 700-702, Oct. 2005.

(Continued)

*Primary Examiner* — Timothy Thompson
*Assistant Examiner* — Charles Pizzuto (57) ABSTRACT

Capacitor structures having multiple layers of vertically interdigitated metal plates.

13 Claims, 8 Drawing Sheets

(56) References Cited

U.S. PATENT DOCUMENTS

2016/0155698 A1* 6/2016 Koo .................... H01L 23/5223
257/532

OTHER PUBLICATIONS

Zhang, et al., A Novel Interdigital Capacitor with Accurate Model for Left-Handed Metamaterials, Proceedings of Asia-Pacific Microwave Conference, pp. 1463-1465, 2010.

Zhu, et al., Accurate Circuit Model of Interdigital Capacitor and Its Application to Design of New Quasi-Lumped Miniaturized Filters with Suppression of Harmonic Resonance, IEEE Transactions on Microwave Theory and Techniques, vol. 48, No. 3, pp. 347-356, Mar. 2000.

* cited by examiner

PRIOR ART

CAPACITOR STRUCTURE AND CAPACITOR USING THE SAME

This application is filed under 35 U.S.C. § 371 and claims priority to International Application No. PCT/CN2014/071685, filed Jan. 28, 2014, the disclosure of which is fully incorporated herein by reference.

TECHNICAL FIELD

Embodiments of the invention generally relate to capacitor structures, and specifically to a capacitor structure having multiple layers of vertically interdigitated metal plates and further to a wideband vertically-interditigal-capacitor (VIC) using the capacitor structure.

BACKGROUND

This section introduces aspects that may facilitate a better understanding of the disclosure. Accordingly, the statements of this section are to be read in this light and are not to be understood as admissions about what is in the prior art or what is not in the prior art.

Figure 1:
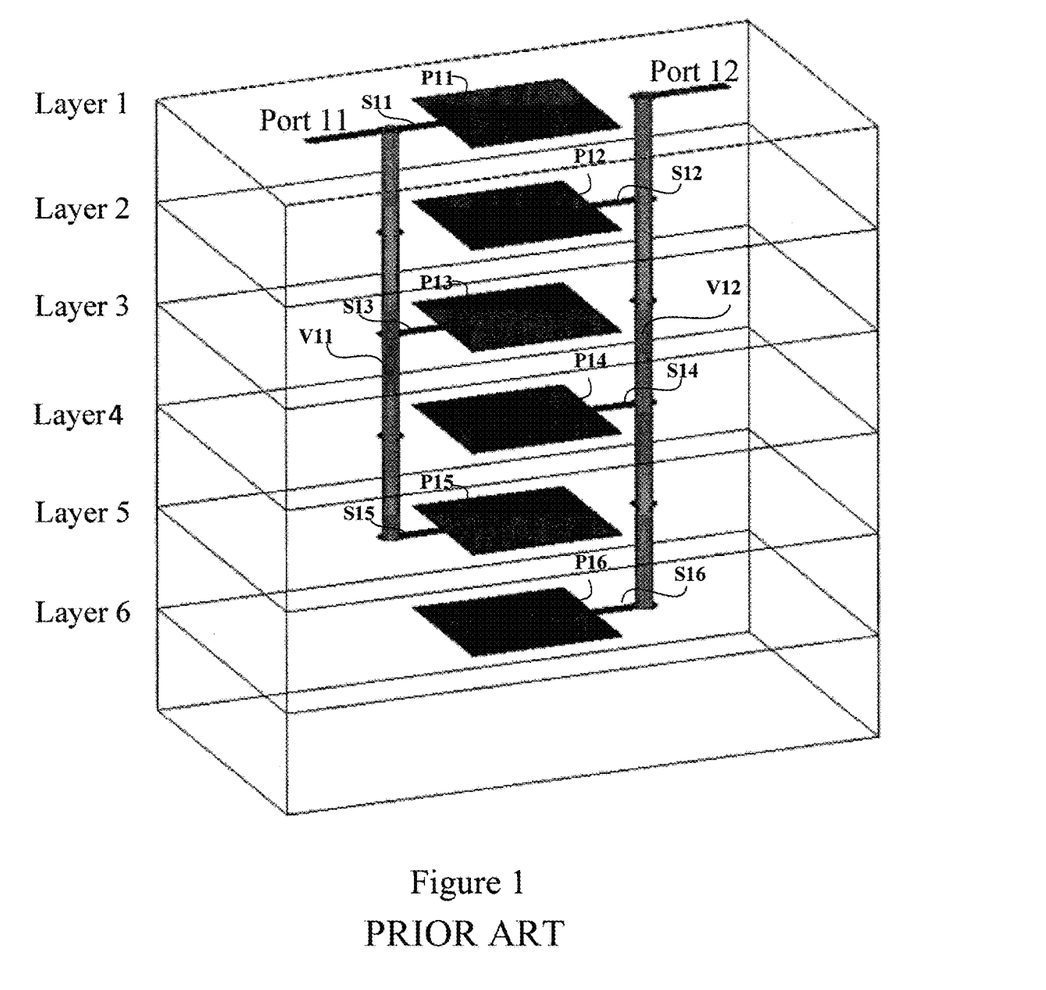
FIG. 1 illustrates a conventional VIC structure in a prior art.

VICs are widely used to build lumped-element based components in multilayered low-temperature co-fired ceramic (LTCC) substrates, as shown in FIG. 1. However, a VIC, as a dual port device, shows a number of additional undesired resonant frequencies that limit its operational bandwidth. Particularly, spurious spikes in |S11|, which is defined as an input reflection coefficient of a dual port device with its output port being terminated by a matched load, and in |S21|, which is defined as a forward transmission insertion loss of the dual port device with its output port being terminated by a matched load can be observed at several frequencies. These frequencies where the spurious spikes occur limit the bandwidth of the VIC. Moreover, an increase in the number of fingers (which will interchangeably be referred to as metal plates hereafter) may result in more undesired resonances at lower frequencies, which may further limit the bandwidth of the VIC.

For a planar interdigital capacitor, spurious spikes can be reduced by using inductive parts as recited in reference document [1], bond wires as recited in reference document [2] or a slotted ground structure with via holes as recited in reference document [3] between interval fingers of the planar interdigital capacitor. However there is not any effective approach for removing or reducing spurious spikes of a vertically-interditigal-capacitor for bandwidth enhancement.

REFERENCE DOCUMENTS

[1] L. Zhu and K. Wu, Accurate circuit model of interdigital capacitor and its application to design of new quasi-lumped miniaturized filters with suppression of harmonic resonance [J], IEEE Trans. Microw. Theory Tech., vol. 48, no. 3, pp. 347-356, 2000
[2] F. P. Casares-Miranda, P. Otero, E. Márquez-Segura, and C. Camacho-Penalosa, Wire bonded interdigital capacitor, IEEE Microwave and Wireless Components Letters, vol. 15, no. 10, pp. 700-702, 2005
[3] H. L. Zhang, X. Y. Zhang and B. J. Hu, A novel interdigital capacitor with accurate model for left-handed metamaterials, Proc. IEEE Asia-Pacific Microwave Conf., Yokohama, Japan, 2010, pp. 1463-1465.

SUMMARY

Various embodiments of the invention aim at addressing at least part of the above problems and disadvantages. Other features and advantages of embodiments of the invention will also be understood from the following description of specific embodiments when read in conjunction with the accompanying drawings, which illustrate, by way of example, the principles of embodiments of the invention.

Various aspects of embodiments of the invention are set forth in the appended claims and summarized in this section. It shall be understood that the scope of the invention is limited by the appended claims.

In a first aspect of the invention, a capacitor structure is provided. The capacitor structure comprises: a first plurality of metal plates that are vertically disposed with their surfaces being parallel to each other; a second plurality of metal plates that are interdigitated with the first plurality of metal plates with their surfaces being parallel to the surfaces of the first plurality of metal plates; a first port electrically connected to each of the first plurality of metal plates through a first plurality of port connecting strips and via a first port via interconnection; and a second port electrically connected to each of the second plurality of metal plates through a second plurality of port connecting strips and via a second port via interconnection. The first plurality of metal plates is connected together at an end of each of the first plurality of metal plates opposite to the end at which the first port is connected. The second plurality of metal plates is connected together at an end of each of the second plurality of metal plates opposite to the end at which the second port is connected. A direction in which the first plurality of port connecting strips extends is in a certain angle with the direction in which the second plurality of port connecting strips extends.

With this capacitor structure, the spurious spikes in a VIC device can be reduced so that the bandwidth of the VIC device can be effectively increased, and meanwhile the capacitance and Q-factor of the VIC device have a slight increment.

In some embodiments, the first plurality of metal plates is connected together through a first plate via interconnection; and the second plurality of metal plates is connected together through a second plate via interconnection.

In some embodiments, the first plate via interconnection vertically passes through clearances formed in the second plurality of metal plates without contacting the clearances and is electrically connected to each of the first plurality of metal plates; or the first plate via interconnection is electrically connected to each of the first plurality of metal plates through a first plurality of plate connecting strips.

In some embodiments, the second plate via interconnection vertically passes through clearances formed in the first plurality of metal plates without contacting the clearances and is electrically connected to each of the second plurality of metal plates; or the second plate via interconnection is electrically connected to each of the second plurality of metal plates through a second plurality of plate connecting strips.

In some embodiments, a connecting portion between each of the first plurality of metal plates with the first plate via interconnection or a corresponding one of the first plurality of plate connecting strips is located on an extension line of a corresponding one of the first plurality of port connecting strips. Preferably, the extension line extends through a center on a corresponding one of the first plurality of metal plates.

In some embodiments, a connecting portion between each of the second plurality of metal plates with the second plate via interconnection or a corresponding one of the second plurality of plate connecting strips is located on an extension line of a corresponding one of the second plurality of port connecting strips. Preferably, the extension line extends through a center on a corresponding one of the second plurality of metal plates.

In some embodiments, the certain angle is 90 degrees or 180 degrees.

In some embodiments, each of the first plurality of metal plates and the second plurality of metal plates is rectangular.

In a second aspect of the invention, a vertically-interdigital-capacitor employing the capacitor structure according to the first aspect of the invention is provided.

In some embodiments, spacing between any two adjacent metal plates of the vertically-interdigital-capacitor is filled with a dielectric material.

In some embodiments, each of the first plurality of metal plates and the second plurality of metal plates of the vertically-interdigital-capacitor is buried in respective low-temperature co-fired ceramic (LTCC) substrates, respective liquid crystal polymer (LCP) substrates, or respective printed circuit board (PCB) layers.

According to particular embodiments in relation to the proposed capacitor structure and the vertically-interdigital-capacitor employing the proposed structure as described in this specification, the spurious spikes at lower frequencies can be reduced and the undesired resonances can be shifted to much higher frequencies so that the bandwidth of the vertically-interdigital-capacitor can be significantly increased. Meanwhile, the capacitance and Q-factor of the vertically-interdigital-capacitor has a slight increment.

BRIEF DESCRIPTION OF THE DRAWINGS

The above and other aspects, features, and benefits of various embodiments of the invention will become more fully apparent, by way of example, from the following detailed description with reference to the accompanying drawings, in which like reference numerals or letters are used to designate like or equivalent elements. The drawings are illustrated for facilitating better understanding of the embodiments of the invention and not necessarily drawn to scale, in which.

DETAILED DESCRIPTION

Hereinafter, the principle and spirit of the present invention will be described with reference to the illustrative embodiments. It should be understood, all these embodiments are given merely for the skilled in the art to better understand and further practice the present invention, but not for limiting the scope of the present invention. For example, features illustrated or described as part of one embodiment may be used with another embodiment to yield still a further embodiment. In the interest of clarity, not all features of an actual implementation are described in this specification.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It shall be understood that, although the terms "first", "second" etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed terms.

The terminology used herein is for the purpose of describing particular embodiments only and is not intended to be liming of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof.

In the following description and claims, unless defined otherwise, all technical and scientific terms used herein have the same meaning as commonly understood by one of ordinary skill in the art to which this invention belongs.

Reference is first made to FIG. 1, in which the structure of a conventional VIC is illustrated. The conventional VIC is a multi-conductor on a multilayered structure, which presents pass and stop-bands and has a plurality of vertically interdigitated metal plates, which may also be referred to as "fingers". In the following, the terms "metal plate" and "finger" may be used interchangeably to refer to the same element.

The illustrated conventional VIC in FIG. 1 exemplarily comprises six layers (Layer 1-6) of substrates. In each of the substrates is buried a metal plate. The odd-numbered metal plates P11, P13 and P15 are electrically connected through metal strips S11, S13, and S15 and via a first port via interconnection V11 to a first port (Port11). Similarly, the even-numbered metal plates P12, P14 and P16 are electrically connected through metal strips S12, S14, and S16 and via a second port via interconnection V12 to a second port (Port12). In the conventional VIC, all ends of the odd-numbered metal plates P11, P13 and P15 which are opposite to the ends where the first port Port1 is connected are open (which will be referred to as open ends hereafter), and all ends of the even-numbered metal plates P12, P14 and P16 which are opposite to the ends where the second port Port2 is connected are also open.

Figure 2:
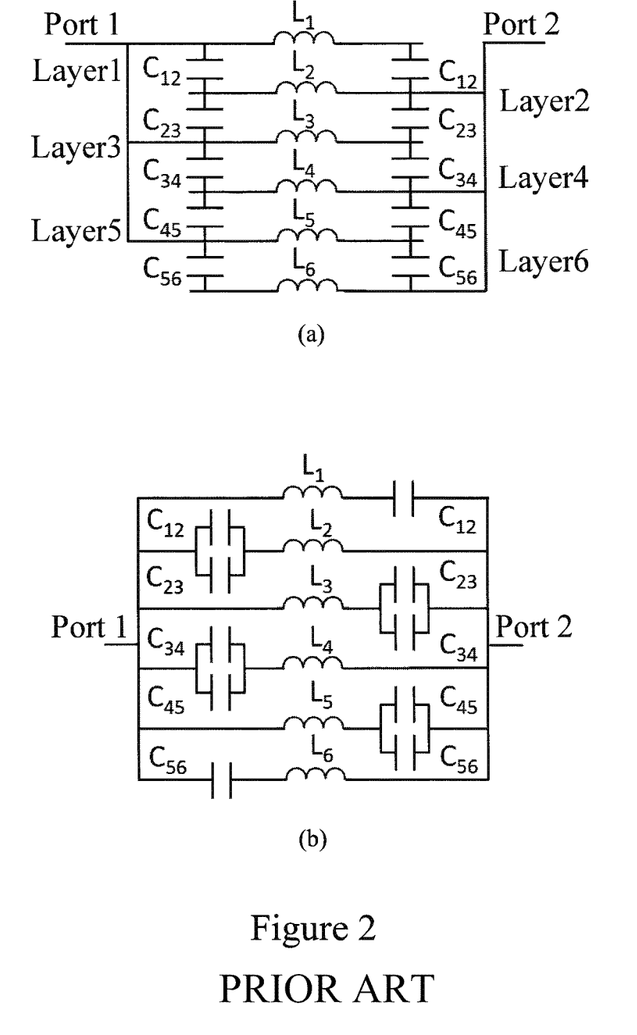
FIG. 2 illustrates an equivalent circuit and its equivalent transformational circuit of the conventional VIC as illustrated in FIG. 1.

An equivalent circuit and its equivalent transformational circuit of the conventional VIC are illustrated in FIGS. 2(a) and (b). A finger of the conventional VIC can be represented by a serial inductance ($L_1$, $L_2$, $L_3$, $L_4$, $L_5$ or $L_6$) and a shunt capacitance ($C_{12}$, $C_{23}$, $C_{34}$, $C_{45}$, or $C_{56}$), which is drawn as two separate capacitances in the figure. Capacitive coupling effect between adjacent fingers is modeled by the capacitance $c_{ij}$, where i and j are the finger numbers. It can be seen from FIGS. 2(a) and (b) that the inductances and capacitances are separately distributed, which contributes to the undesired resonances that limits the bandwidth of the VIC.

According to embodiments of the present invention, a VIC structure is proposed. The VIC structure comprises: a first plurality of metal plates that are vertically disposed with their surfaces being parallel to each other; a second plurality of metal plates that are interdigitated with the first plurality of metal plates with their surfaces being parallel to the surfaces of the first plurality of metal plates; a first port electrically connected to each of the first plurality of metal plates through a first plurality of port connecting strips and via a first port via interconnection; and a second port electrically connected to each of the second plurality of metal plates through a second plurality of port connecting strips and via a second port via interconnection. In the VIC structure according to the embodiments of the present invention, the first plurality of metal plates is connected together at an end of each of the first plurality of metal plates opposite to the end at which the first port is connected; the second plurality of metal plates is connected together at an end of each of the second plurality of metal plates opposite to the end at which the second port is connected; and a direction in which the first plurality of port connecting strips extends is in a certain angle with the direction in which the second plurality of port connecting strips extends.

Hereafter, the VIC structure according to embodiments of the present invention will be described in details with reference to FIGS. 3-8.

First Embodiment

Figure 3:
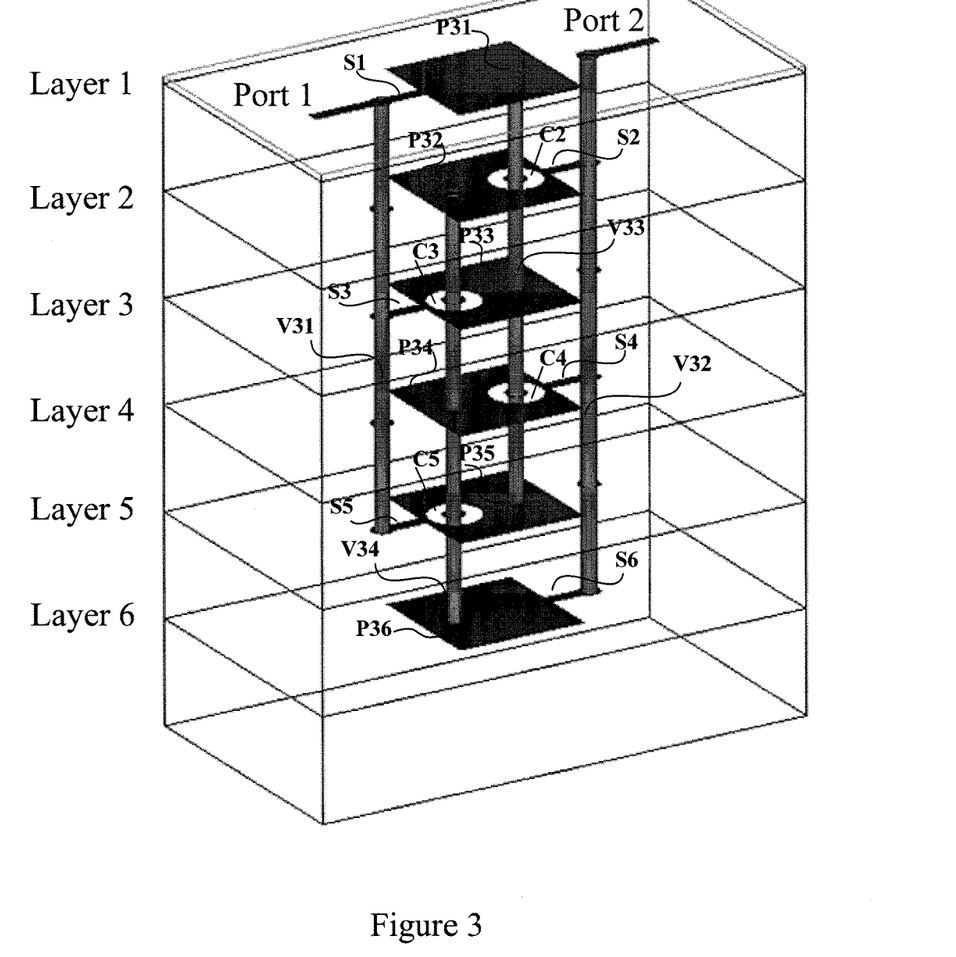
FIG. 3 illustrates the structure of an example VIC according to a first embodiment of the present invention.

Now referring to FIG. 3, the structure of an example VIC according to a first embodiment of the present invention is illustrated. The VIC structure as shown in FIG. 3 comprises: a first plurality of metal plates P31, P33 and P35 in Layer1, Layer3 and Layer5, i.e. odd-numbered metal plates that are vertically disposed with their surfaces being parallel to each other; a second plurality of metal plates P32, P34 and P36 in Layer2, Layer4 and Layer6, i.e. even-numbered metal plates that are interdigitated with the first plurality of metal plates with their surfaces being parallel to the surfaces of the first plurality of metal plates; a first port (which is labeled as Port1 in FIG. 3) that is electrically connected to each of the first plurality of metal plates through a first plurality of port connecting strips S1, S3 and S5 and via a first port via interconnection V31; and second port (which is labeled as Port2 in FIG. 3) that is electrically connected to each of the second plurality of metal plates through a second plurality of port connecting strips S2, S4 and S6 and via a second port via interconnection V32.

In this capacitor structure, the first plurality of metal plates P31, P33 and P35 is connected together at an end of each of the first plurality of metal plates that is opposite to the end at which the first port Port1 is connected; and the second plurality of metal plates is connected together at an end of each of the second plurality of metal plates P32, P34 and P36 that is opposite to the end at which the second port Port2 is connected. Moreover, a direction in which the first plurality of port connecting strips extends is in a certain angle with the direction in which the second plurality of port connecting strips extends. In this embodiment, the certain angle is preferably set as 180 degrees. However, a person skilled in the art shall understand that other angle values are also possible, such as 90 degrees and the scope of the present invention is not limited to any particular value of the certain angle.

In this embodiment, numbers of the first and second plurality of metal plates are illustrated as three, respectively. However, these numbers shall be regarded as illustrative instead of limiting, which can be adjusted according to practical performance requirements. Generally, each of the first and second plurality of metal plates may be shaped as rectangles, preferably as squares as shown. However, a person skilled in the art shall understand that other shapes, such as circles, are also possible. The scope of the present invention is not limited to any particular shape of the metal plate or any particular number of the metal plates.

As compared to the capacitor structure of FIG. 1 in which all ends of the metal plates P11, P13 and P15 which are opposite to the ends where the first port is connected are open and all ends of the metal plates P12, P14 and P16 which are opposite to the ends where the second port is connected are also open, in the first embodiment of the present invention, the open ends of the first plurality of metal plates P31, P33 and P35 are electrically connected together, and the open ends of the second plurality of metal plates P32, P34 and P36 are also electrically connected together.

Figure 4:
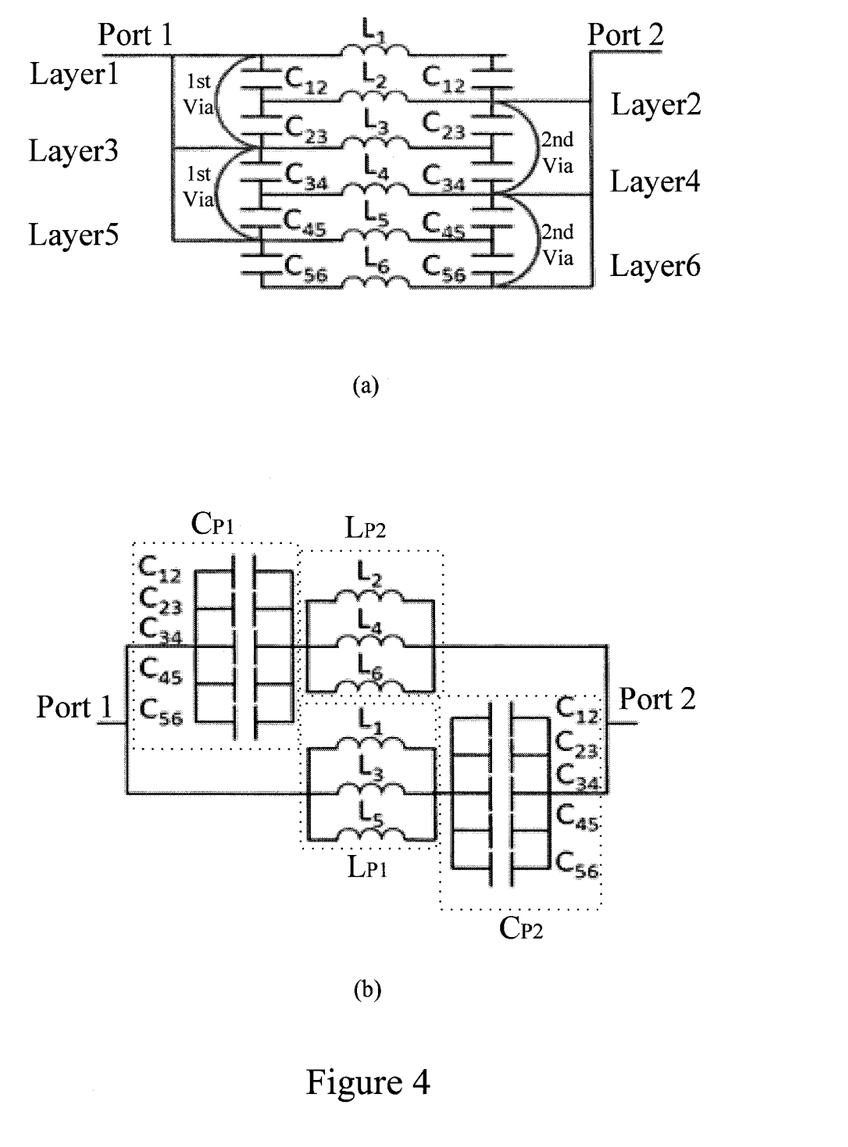
FIG. 4 illustrates an equivalent circuit and its equivalent transformational circuit of the example VIC as illustrated in FIG. 3.

By electrically connecting the open ends of the corresponding metal plates, the equivalent circuit of the capacitor structure according to the embodiment of the present invention and its equivalent transformational circuit are changed into those as shown in FIG. 4. As illustrated, thanks to the electrical connection of the open ends of the metal plates in Layer1, Layer3 and Layer5, capacitances $C_{12}$, $C_{23}$, $C_{34}$, $C_{45}$ and $C_{56}$ close to Port1 can be equivalently aggregated as $C_{P1}$ and inductances $L_1$, $L_3$ and $L_5$ can be aggregated as $L_{P1}$. Similarly, thanks to the electrical connection of the open ends of the metal plates in Layer2, Layer4 and Layer6, capacitances $C_{12}$, $C_{23}$, $C_{34}$, $C_{45}$ and $C_{56}$ close to Port2 can be equivalently aggregated as $C_{P1}$ and inductances $L_2$, $L_4$ and $L_6$ can be aggregated as $L_{P2}$. The proposed capacitor structure according to the embodiment of the present invention combines the capacitances and inductances in parallel, respectively and accordingly the undesired resonances at lower frequencies caused by separate capacitances and inductances can be reduced. Additionally, the combination of the capacitances and inductances mainly result in shifting of the undesired resonances to higher frequencies and a slight increment of the capacitance and Q-factor of a vertically-interdigital capacitor.

In the illustrated example of this embodiment, the first plurality of metal plates may be connected together through a first plate via interconnection V33; and the second plurality of metal plates are connected together through a second plate via interconnection V34.

As illustrated in FIG. 1, the first plate via interconnection V33 may vertically pass through clearances C2 and C4 formed in the metal plates P32 and P34 without contacting the clearances and meanwhile be electrically connected to each of the first plurality of metal plates P31, P33 and P35. Similarly, the second plate via interconnection V34 may vertically pass through clearances C3 and C5 formed in the metal plates P33 and P35 without contacting the clearances and meanwhile be electrically connected to each of the second plurality of metal plates P32, P34 and P36. However, a person skilled in the art shall understand that other manners for connecting the open ends of the metal plates are also possible, as long as they can realize the expected function of the embodiments of the present invention.

Preferably, a connecting portion between each of the first plurality of metal plates P31, P33 and P35 and the first plate via interconnection V33 is on an extension line of the corresponding one of the first plurality of port connecting strips S1, S3, and S5. Further preferably, the extension line extends through the center on the corresponding one of the first plurality of metal plates. For example, in a case where each of the first plurality of metal plates is rectangular, the extension line is the central line of the corresponding rectangular metal plate which is parallel with two sides of it and thus the aforesaid connecting portion will be located in the middle of the other two sides of the metal plate.

Additionally or alternatively, a connecting portion between each of the second plurality of metal plates P32, P34 and P36 and the second plate via interconnection V34 is on an extension line of the corresponding one of the second plurality of port connecting strips S2, S4, and S6. Preferably, the extension line extends through the center on the corresponding one of the second plurality of metal plates P32, P34, and P36. For example, in a case where each of the second plurality of metal plates is rectangular, the extension line is the central line of the corresponding rectangular metal plate which is parallel with two sides of it and thus the aforesaid connecting portion will be located in the middle of the other two sides of the metal plate.

Second Embodiment

Figure 5:
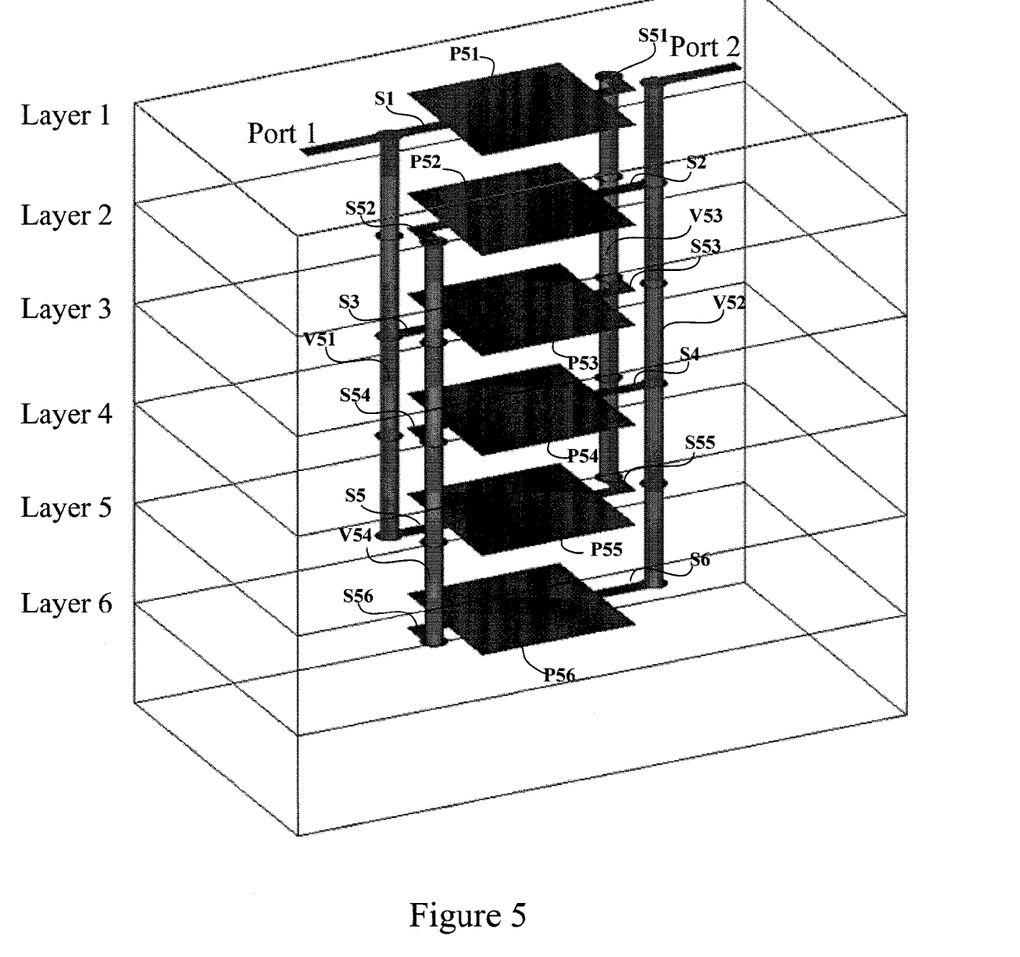
FIG. 5 illustrates the structure of an example capacitor according to a second embodiment of the present invention.

FIG. 5 illustrates the structure of an example capacitor according to a second embodiment of the present invention. The illustrated example capacitor structure is the same as the structure of the first embodiment except for the manner of connecting the open ends of the metal plates through two via interconnections. For the sake of brevity and simplicity of disclosure, descriptions for the same parts in this capacitor structure will not be repeated hereafter.

In the illustrated embodiment, the first plate via interconnection V53 may be electrically connected to each of the first plurality of metal plates P51, P53 and P55 at the end which is opposite to the end where the first port Port1 is connected, respectively through a first plurality of plate connecting strips S51, S53 and S55. Similarly, the second plate via interconnection V54 may be electrically connected to each of the second plurality of metal plates P52, P54 and P56 at the end which is opposite to the end where the second port Port2 is connected, respectively through a second plurality of plate connecting strips S52, S54 and S56. As illustrated, each of the first and second plurality of plate connecting strips is in an "L" shape. However, a person skilled in the art shall understand that other shapes are also possible as along as they can achieve the expected function of the embodiments of the invention. The scope of the invention is not limited to any particular shape of the plate connecting strips.

Preferably, a connecting portion between each of the first plurality of metal plates P51, P53, and P55 and a corresponding one of the first plurality of plate connecting strips S51, S53 and S55 is located on an extension line of a corresponding one of the first plurality of port connecting strips S1, S3 and S5. Further preferably, the extension line extends through the center on the corresponding one of the first plurality of metal plates. For example, in a case where each of the first plurality of metal plates is rectangular, the extension line is the central line of the corresponding rectangular metal plate which is parallel with two sides of it and thus the aforesaid connecting portion will be located in the middle of the other two sides of the metal plate.

Additionally or alternatively, a connecting portion between each of the second plurality of metal plates P52, P54, and P56 and a corresponding one of the second plurality of plate connecting strips S52, S54 and S56 is located on an extension line of a corresponding one of the second plurality of port connecting strips S2, S4 and S6. Preferably, the extension line extends through the center on the corresponding one of the second plurality of metal plates. For example, in a case where each of the second plurality of metal plates is rectangular, the extension line is the central line of the corresponding rectangular metal plate which is parallel with two sides of it and thus the aforesaid connecting portion will be located in the middle of the other two sides of the metal plate.

In the illustrated case where all of the metal plates are configured as rectangles, each of the first plurality of plate connecting strips S51, S53 and S55 may be electrically connected in the middle of a first side of the corresponding metal plate P51, P53, or P55 and each of the second plurality of plate connecting strips S52, S54 and S56 may be electrically connected in the middle of a second side of the corresponding metal plate P52, P54, or P56, wherein the first side parallel vertical to the second side.

Although in the second embodiment, the first and second via interconnects V53 and V54 interconnect the corresponding open ends of respective metal plates in the same manner, i.e. through the plate connecting strips, it is also possible that they interconnect the open ends in different manners. For example, the first plate via interconnection V53 may interconnect the open ends of the first plurality of metal plates through the plate connecting strips as shown in FIG. 5, while the second plate via interconnection V54 may vertically pass through the clearances formed in the first plurality of metal plates without contacting the clearances and meanwhile be electrically connected to each of the second plurality of metal plates as shown in FIG. 3, or vice versa. Simply speaking, features illustrated or described as part of one embodiment of the present invention may be used with another embodiment to yield still a further embodiment, which also falls within the scope of the present invention.

According to the second embodiment, it is possible to achieve the same effect as the first embodiment. That is, the separate capacitances and inductances may be aggregated together and thus the spurious resonances at lower frequencies are reduced so that the bandwidth is increased while the capacitance is maintained.

Third Embodiment

Figure 6:
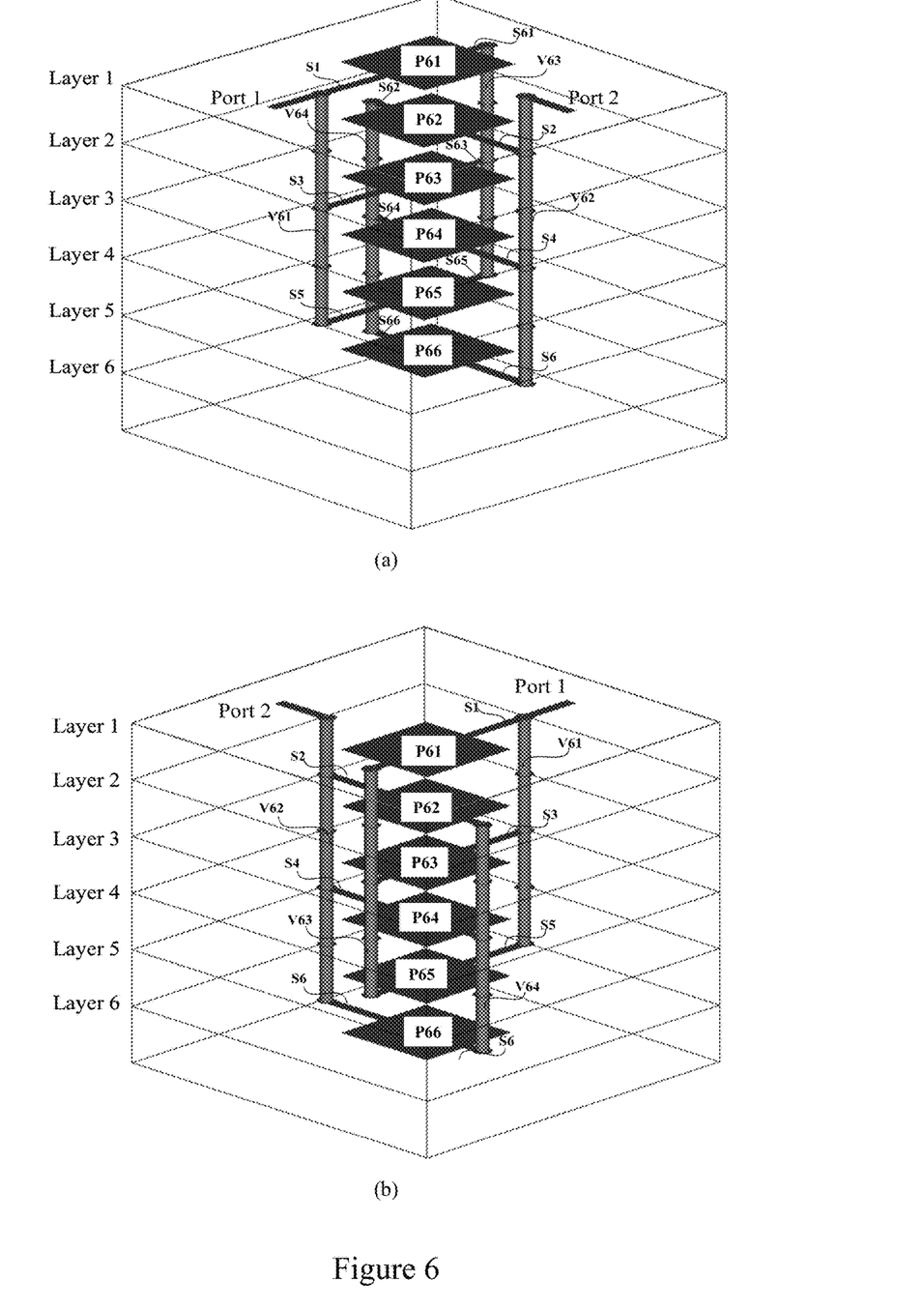
FIG. 6 illustrates the structure of an example capacitor according to a third embodiment of the present invention.

FIG. 6 illustrates the structure of an example capacitor according to a third embodiment of the present invention. The illustrated example capacitor structure is the same as the structure of the second embodiment except that locations of the first port, the second port and the first and second plate via interconnections relative to the metal plates are changed. For the sake of brevity and simplicity of disclosure, descriptions for the same parts in this capacitor structure will not be repeated herein.

In the third embodiment, the certain angle between the first direction in which the first plurality of port connecting strip S1, S3, and S5 (coupled by interconnection V61) extends and the second direction in which the second plurality of port connecting strip S2, S4 and S6 (coupled by interconnection V62) extends may be set as 90 degrees. Similarly to the second embodiment, the open ends of the first plurality of metal plates P61, P63, and P65 are electrically connected together through the first plurality of plate connecting strips S61, S63 and S65 and via the first plate via interconnection V63, for example. and the open ends of the second plurality of metal plates P62, P64, and P66 are electrically connected together through the second plurality of plate connecting strips S62, S64 and S66 and via the first plate via interconnection V64, for example. A person skilled in the art shall understand that the open ends of the first and/or second plurality of metal plates may also be electrically connected together in the manner as illustrated in FIG. 3.

In the illustrated case where all of the metal plates are configured as rectangles, each of the first plurality of plate connecting strips S61, S63 and S65 is electrically connected in the middle of a first side of the corresponding metal plate P61, P63, or P65 and each of the second plurality of plate connecting strips S62, S64 and S66 is electrically connected in the middle of a second side of the corresponding metal plate P62, P64, or P66, wherein the first side is vertical to the second side.

FIG. 6(b) illustrates another example capacitor structure according to the third embodiment of the present invention, in which the locations of the first port Port1 and the second port Port2 as well as the first and second plate via interconnections V63 and V64 are rotated 180 degrees relative to the capacitor structure as illustrated in FIG. 6(a).

According to the third embodiment, it is possible to achieve the same effect as the first and second embodiments. That is, the separate capacitances and inductances may be aggregated together and thus the spurious resonances at lower frequencies can be reduced so that the bandwidth can be increased while the capacitance is maintained.

In the above embodiments or some other embodiments, the first and second metal plates may generally be made of gold, silver and copper etc. Thicknesses of the first and second plurality metal plates and spacing between any two adjacent metal plates are usually configured to be equal. Preferably, sizes of all metal plates are set equal and their centers are vertically aligned. Preferably, the thickness of each of the first and second metal plates and the spacing may be configured as 0.1 mm. Further preferably, the width of each of the port connecting strips S1~S6 and the first and second plurality of plate connecting strips may be not more than ¼ waveguide wavelength.

The capacitor structure according to embodiments of the present invention as shown in FIGS. 3, 5 and 6 can be formed in multiple layers of substrates, which can be semiconductor substrates in which a semiconductor device, such as a VIC device can be formed. In a vertically-interdigital-capacitor employing the capacitor structure according to the first, second or third embodiment of the present invention, spacing between a pair of adjacent metal plates may be filled with a dielectric material, such as ceramic, crystal and Teflon and the like. Each of the first plurality of metal plates and the second plurality of metal plates may be buried in respective semiconductor substrates, such as low-temperature co-fired ceramic (LTCC) substrates, liquid crystal polymer (LCP) substrates, or printed circuit board (PCB) layers. The LTCC can be Ferro-A6, dupond 951, or dupond943 etc.

In the following, a specific example VIC employing the capacitor structure according to the first embodiment will be described. A person skilled in the art shall understand that the specific example is given just for illustrating the technical effects of the embodiments of the present invention rather than limiting the present invention in any particular form.

Figure 7:
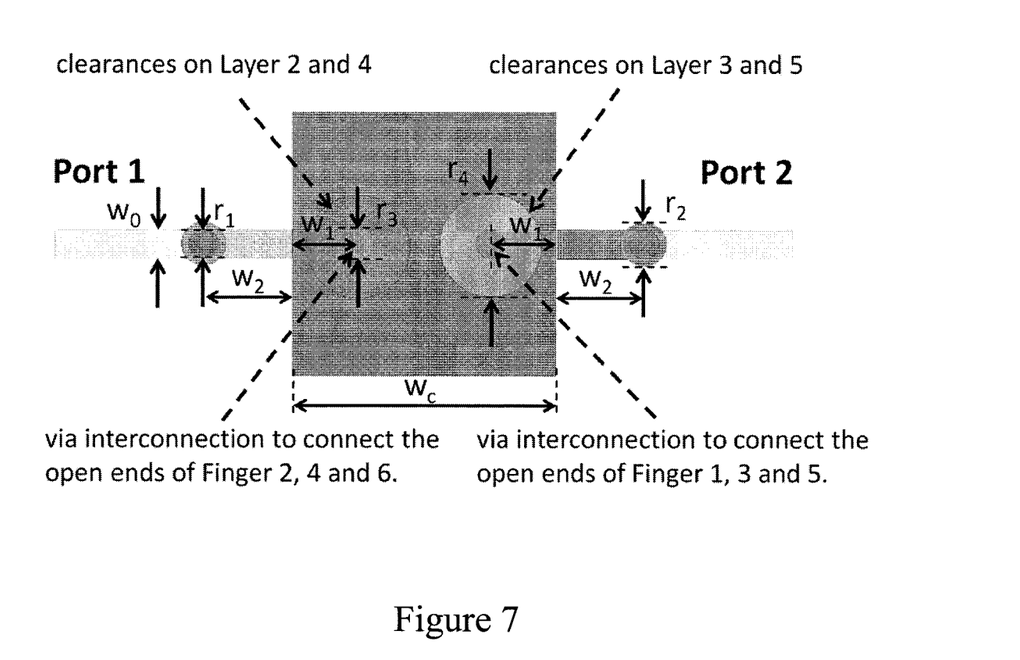
FIG. 7 illustrates a plane layout of the example capacitor according to the first embodiment of the present invention, in which dimensions of metal plates, various via interconnections, clearances, and various strips are particularly defined.

In this example, the VIC is buried in a six-layer LTCC substrate, which is made of Ferro-A6 material with a dielectric constant of 5.9 and loss tangent of 0.002. Each LTCC layer has a thickness of 0.096 mm. FIG. 7 shows a plane layout of the VIC, in which dimensions of the metal plates, various via interconnections, clearances, and various strips are particularly defined. AXIEM, which is a full-wave electromagnetic (EM) solver based on the spectral domain method of moments is selected for EM-optimization and verification. After the optimization, the final optimal dimension parameters are $w_0=0.2$ mm, $w_1=0.6$, $w_2=0.5$, $w_c=1.8$ mm, $r_1=0.2$ mm, $r_2=0.3$ mm, $r_3=0.2$ mm and $r_4=0.4$ mm.

Figure 8:
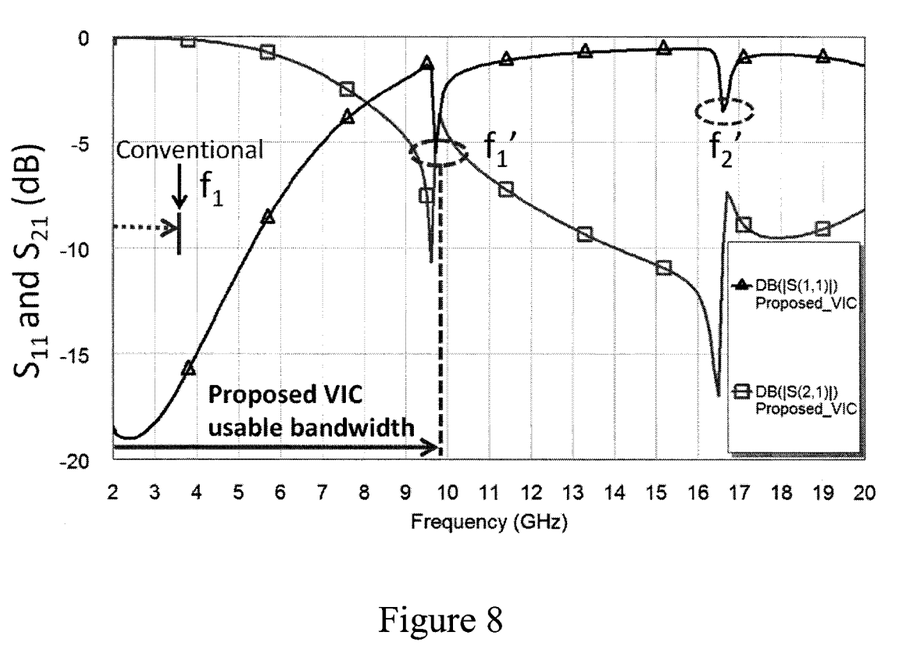
FIG. 8 illustrates an EM-simulation result for the example capacitor as illustrated in FIG. 7.

FIG. 8 shows the simulation result for the VIC with the above optimal dimension parameters, from which it can be seen that as compared to a conventional VIC made in the same shape and of the same materials and with the same values for parameters $w_0$, $w_2$, $r_1$, $r_2$, and $w_c$, the spurious spike at frequency $f_1$ in |S1| and |S21| shifts from 3.4 GHz to 9.8 GHz. That is, the bandwidth of the proposed VIC according to the embodiment of the present invention is improved from 3.4 GHz to 9.8, which means 188% improvement of the bandwidth.

It will be obvious to a person skilled in the art that, as the technology advances, the inventive concept can be implemented in various ways. The invention and its embodiments are not limited to the examples described above but may vary within the scope of the claims.

While this specification contains many specific implementation details, these should not be construed as limitations on the scope of any implementation or of what may be claimed, but rather as descriptions of features that may be specific to particular embodiments of particular implementations. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

While the invention has been described in terms of several embodiments, those skilled in the art will recognize that the invention is not limited to the embodiments described, and can be practiced with modification and alteration within the disclosure and scope of the appended claims. The description is thus to be regarded as illustrative instead of limiting.

What is claimed is:

1. A capacitor structure, comprising:
    a first plurality of metal plates that are vertically disposed with their surfaces being parallel to each other;
    a second plurality of metal plates that are interdigitated with the first plurality of metal plates with their surfaces being parallel to the surfaces of the first plurality of metal plates;
    a first port electrically connected to each of the first plurality of metal plates through a first plurality of port connecting strips and via a first port via interconnection; and, a second port electrically connected to each of the second plurality of metal plates through a second plurality of port connecting strips and via a second port via interconnection;
    wherein the first plurality of metal plates is connected together at an end of each of the first plurality of metal plates opposite to an end at which the first port is connected;
    the second plurality of metal plates is connected together at an end of each of the second plurality of metal plates opposite to an end at which the second port is connected; and,
    a direction in which the first plurality of port connecting strips extends is in a certain angle with the direction in which the second plurality of port connecting strips extends.

2. The capacitor structure according to claim 1, wherein:
the first plurality of metal plates are connected together through a first plate via interconnection; and,
the second plurality of metal plates are connected together through a second plate via interconnection.

3. The capacitor structure according to claim 2, wherein:
the first plate via interconnection vertically passes through clearances formed in the second plurality of metal plates without contacting the clearances and is electrically connected to each of the first plurality of metal plates; or,
the first plate via interconnection is electrically connected to each of the first plurality of metal plates through a first plurality of plate connecting strips.

4. The capacitor structure according to claim 3, wherein:
the second plate via interconnection vertically passes through clearances formed in the first plurality of metal plates without contacting the clearances and is electrically connected to each of the second plurality of metal plates; or,
the second plate via interconnection is electrically connected to each of the second plurality of metal plates through a second plurality of plate connecting strips.

5. The capacitor structure according to claim 4, wherein:
a connecting portion between each of the first plurality of metal plates with the first plate via interconnection or a corresponding one of the first plurality of plate connecting strips is on an extension line of a corresponding one of the first plurality of port connecting strips.

6. The capacitor structure according to claim 5, wherein:
the extension line extends through a center on a corresponding one of the first plurality of metal plates.

7. The capacitor structure according to claim 4, wherein:
a connecting portion between each of the second plurality of metal plates with the second plate via interconnection or a corresponding one of the second plurality of plate connecting strips is on an extension line of a corresponding one of the second plurality of port connecting strips.

8. The capacitor structure according to claim 7, wherein:
the extension line extends through a center on a corresponding one of the second plurality of metal plates.

9. The capacitor structure according to claim 1, wherein:
the certain angle is 90 degrees or 180 degrees.

10. The capacitor structure according to claim 1, wherein each of the first plurality of metal plates and the second plurality of metal plates is rectangular.

11. A capacitor employing the capacitor structure according to claim 1.

12. The capacitor according to claim 11, wherein spacing between any two adjacent metal plates is filled with a dielectric material.

13. The capacitor according to claim 1, wherein each of the first plurality of metal plates and the second plurality of metal plates is buried in respective low-temperature co-fired ceramic (LTCC) substrates, respective liquid crystal polymer (LCP) substrates, or respective printed circuit board (PCB) layers.

* * * * *